US010901470B2

(12) United States Patent
Aimone

(10) Patent No.: US 10,901,470 B2
(45) Date of Patent: *Jan. 26, 2021

(54) POWER DISTRIBUTION UNIT SELF-IDENTIFICATION

(71) Applicant: Oracle International Corporation, Redwood Shores, CA (US)

(72) Inventor: Jon K. Aimone, Tracy, CA (US)

(73) Assignee: Oracle International Corporation, Redwood Shores ( * ) Notice: Subject to any disclaimer, the term of this patent is extended or adjusted under 35 U.S.C. 154(b) by 0 days.

This patent is subject to a terminal disclaimer.

(21) Appl. No.: 16/831,181

(22) Filed: Mar. 26, 2020

(65) Prior Publication Data

US 2020/0225718 A1 Jul. 16, 2020

Related U.S. Application Data

(63) Continuation of application No. 15/415,500, filed on Jan. 25, 2017, now Pat. No. 10,642,321.

(51) Int. Cl.
*G06F 1/18* (2006.01)
*H05K 7/14* (2006.01)
(52) U.S. Cl.
CPC .......... *G06F 1/189* (2013.01); *H05K 7/1492* (2013.01); *H05K 7/1498* (2013.01)
(58) Field of Classification Search
None
See application file for complete search history.

(56) References Cited

U.S. PATENT DOCUMENTS

| 4,355,303 A | 10/1982 | Phillips et al. |
| 4,745,391 A | 5/1988 | Gajjar |
| 5,214,314 A | 5/1993 | Dillard et al. |
| 7,606,298 B1 | 10/2009 | Weber, Jr. et al. |

(Continued)

FOREIGN PATENT DOCUMENTS

WO 2015024691 A1 2/2015

OTHER PUBLICATIONS

U.S. Appl. No. 15/415,500, Final Office Action dated Apr. 16, 2019, 15 pages.

(Continued)

*Primary Examiner* — Danny Chan
(74) *Attorney, Agent, or Firm* — Kilpatrick Townsend & Stockton LLP

(57) ABSTRACT

A power distribution discovery system includes a power distribution unit (power distribution unit) that provides electrical power to a plurality of equipment modules configured in a computing rack. The power distribution unit includes a first communication circuit coupled to a computing system. The first communication circuit communicates with a second communication circuit configured in each of the subset of equipment modules to receive identifying information associated with each of the subset of equipment modules. The computing system communicates with the first communication circuit to receive the identifying information, and outputs a report indicating the subset of equipment modules that receive electrical power from the power distribution unit. The received identifying information indicates those equipment modules that receive electrical power from the power distribution unit.

20 Claims, 7 Drawing Sheets

(56) References Cited

U.S. PATENT DOCUMENTS

| | | | |
|---|---|---|---|
| 8,674,823 B1 | 3/2014 | Contario et al. | |
| 8,811,377 B1 * | 8/2014 | Weston | H04W 52/0219 370/351 |
| 9,037,881 B2 * | 5/2015 | Mathew | H05K 7/1498 713/300 |
| 9,520,043 B1 | 12/2016 | Alshinnawi et al. | |
| 10,541,099 B1 * | 1/2020 | Gardner | H05K 7/1492 |
| 2003/0201873 A1 | 10/2003 | Cern | |
| 2006/0044117 A1 | 3/2006 | Farkas et al. | |
| 2007/0185981 A1 | 8/2007 | Koga et al. | |
| 2009/0273334 A1 | 11/2009 | Holovacs et al. | |
| 2009/0307515 A1 | 12/2009 | Bandholz et al. | |
| 2010/0001687 A1 * | 1/2010 | Watanabe | B60L 53/65 320/109 |
| 2011/0047188 A1 | 2/2011 | Martins et al. | |
| 2011/0179301 A1 * | 7/2011 | Liu | H05K 7/1498 713/340 |
| 2011/0291813 A1 | 12/2011 | Jansma | |
| 2011/0307115 A1 * | 12/2011 | Pereira | G06Q 10/04 700/296 |
| 2013/0147570 A1 | 6/2013 | Anderson et al. | |
| 2013/0148291 A1 | 6/2013 | Slessman | |
| 2013/0264889 A1 | 10/2013 | Quittek et al. | |
| 2014/0002055 A1 | 1/2014 | Costa | |
| 2014/0015857 A1 | 1/2014 | Smith et al. | |
| 2014/0067294 A1 | 3/2014 | Sivasubramaniam et al. | |
| 2014/0119742 A1 | 5/2014 | Liu et al. | |
| 2015/0008992 A1 | 1/2015 | Black | |
| 2015/0113296 A1 | 4/2015 | Slotten et al. | |
| 2015/0256409 A1 | 9/2015 | Masuyama et al. | |
| 2015/0311649 A1 | 10/2015 | Horne et al. | |
| 2016/0225246 A1 | 8/2016 | Huang et al. | |

OTHER PUBLICATIONS

U.S. Appl. No. 15/415,500, Non-Final Office Action dated Oct. 18, 2018, 15 pages.

U.S. Appl. No. 15/415,500, Non-Final Office Action dated Aug. 7, 2019, 17 pages.

U.S. Appl. No. 15/415,500, Notice of Allowance dated Jan. 2, 2020, 6 pages.

* cited by examiner

POWER DISTRIBUTION UNIT SELF-IDENTIFICATION

CLAIM OF PRIORITY

This application is a continuation of U.S. patent application Ser. No. 15/415,500, filed Jan. 25, 2017, entitled "POWER DISTRIBUTION UNIT SELF-IDENTIFICATION," which is incorporated herein by reference in its entirety for all purposes.

TECHNICAL FIELD

Aspects of the present disclosure relate to computing devices and, in particular, to a power distribution unit discovery system for discovering equipment modules in a computing rack.

BACKGROUND

Many of today's modern computing systems are provided as data centers where relatively large quantities of equipment modules are implemented for use as storage systems, telecommunications systems, and computationally intensive processing systems. To house such equipment modules, computing racks have been developed. Electrical power for these computing devices is typically provided by a power distribution unit in which electrical power from only one or a few sources can be distributed among the multiple equipment modules. In many cases, a computing rack may be configured with multiple power distribution units for various reasons, such as redundancy, power sharing, computing rack wiring organization, and the like. It is quite difficult to determine which power distribution unit is supplying electrical power to each equipment module due to the numerous equipment modules in a rack and the associated cabling.

BRIEF SUMMARY

A first embodiment disclosed herein is a power distribution discovery system for discovering equipment modules comprising a power source and a power distribution unit with a plurality of outlets, each of the plurality of outlets being configured to transfer, from the power source, electrical power to an equipment module of a plurality of equipment modules, each equipment module of the plurality of equipment modules being positioned in a computing rack and connected to a one of the plurality of outlets. The power distribution unit comprises a first communication circuit that facilitates: communication with a plurality of second communication circuits in each of the plurality of equipment modules, and communication with a computing device. The power distribution unit further comprises: one or more data processors and a non-transitory computer readable storage medium containing instructions that when executed on the one or more data processors, cause the one or more data processors to perform actions including: receiving, via the first communication circuit, and from each second communication circuit of the plurality of second communication circuits, an identifying information for an equipment module of the plurality of equipment modules; and generating a report that includes the identifying information. The first embodiment of the power distribution discovery system for discovering equipment modules can further include actions sending, via the first communication circuit and to each second communication circuit of the plurality of second communication circuits, a request for identifying information for an equipment module connected to an outlet of the plurality of outlets, the plurality of equipment modules including the equipment module and further including the sending, via the first communication circuit and to each second communication circuit of the plurality of second communication circuits, a request for identifying information for an equipment module connected to an outlet of the plurality of outlets, the plurality of equipment modules including the equipment module happens at pre-determined intervals in another embodiment. The first embodiment of the power distribution discovery system for discovering equipment modules can further include the actions of receiving, via the first communication circuit, and from each second communication circuit of the plurality of second communication circuits, the identifying information for an equipment module of the plurality of equipment modules happens at pre-determined intervals or receiving, from a computing device, a request for identifying information and sending the report to the computing device. And in further embodiments actions can include receiving, from a computing device, a request for identifying information; and sending the report to the computing device. A further addition to the first embodiment is wherein the identifying information is transmitted through an electrical cable that electrically couples the power distribution unit to the equipment modules.

A second embodiment disclosed herein is a non-transitory, computer-readable medium comprising instructions that, when executed by one or more processors, causes the one or more processors to perform operations to discover equipment modules comprising receiving, via a first communication circuit of a power distribution unit, and from each second communication circuit of a plurality of second communication circuits of a plurality of equipment modules, an identifying information for an equipment module of a plurality of equipment modules. The power distribution unit comprises: a plurality of outlets, each of the plurality of outlets being configured to transfer, from a power source, electrical power to an equipment module of the plurality of equipment modules, each equipment module of the plurality of equipment modules being positioned in a computing rack and connected to an outlet of the plurality of outlets: And the one or more processors to perform operations to discover equipment modules further comprising generating a report that includes the identifying information. And further sending, via the first communication circuit and to each second communication circuit of the plurality of second communication circuits, a request for identifying information for an equipment module connected to an outlet of the plurality of outlets, the plurality of equipment modules including the equipment module and wherein the sending, via the first communication circuit and to each second communication circuit of the plurality of second communication circuits, a request for identifying information for an equipment module connected to an outlet of the plurality of outlets, the plurality of equipment modules including the equipment module happens at pre-determined intervals. And another extension of the embodiment of the non-transitory, computer-readable medium comprising instructions that, when executed by one or more processors, causes the one or more processors to perform operations to discover equipment modules, wherein the receiving, via the first communication circuit, and from each second communication circuit of the plurality of second communication circuits, the identifying information for an equipment module of the plurality of equipment modules happens at pre-determined intervals. Another embodiment further comprises receiving, from a computing device, a request for identifying information; and sending the report to the computing device. Another embodiment further comprises receiving, from a computing device, a request for identifying information; and sending the report to the computing device. An additional embodiment is wherein the identifying information is transmitted through an electrical cable that electrically couples the power distribution unit to the equipment modules.

And yet a third embodiment disclosed herein is a power distribution discovery method for discovering equipment modules, the method comprising receiving, via a first communication circuit of a power distribution unit, and from each second communication circuit of a plurality of second communication circuits of a plurality of equipment modules, an identifying information for an equipment module of a plurality of equipment modules. And wherein the power distribution unit comprises a plurality of outlets, each of the plurality of outlets being configured to transfer, from a power source, electrical power to an equipment module of the plurality of equipment modules, each equipment module of the plurality of equipment modules being positioned in a computing rack and connected to an outlet of the plurality of outlets. And further including the action of generating a report that includes the identifying information. An extension of the third embodiment further comprises sending, via the first communication circuit and to each second communication circuit of the plurality of second communication circuits, a request for identifying information for an equipment module connected to an outlet of the plurality of outlets, the plurality of equipment modules including the equipment module. The third embodiment can also the sending, via the first communication circuit and to each second communication circuit of the plurality of second communication circuits, a request for identifying information for an equipment module connected to an outlet of the plurality of outlets, the plurality of equipment modules including the equipment module happens at pre-determined intervals. Another extension to the third embodiment wherein the receiving, via the first communication circuit, and from each second communication circuit of the plurality of second communication circuits, the identifying information for an equipment module of the plurality of equipment modules happens at pre-determined intervals. The third embodiment may also further comprise receiving, from a computing device, a request for identifying information and sending the report to the computing device or receiving, from a computing device, a request for identifying information and sending the report to the computing device.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters refer to the same parts throughout the different views. The drawings depict only typical embodiments of the present disclosure and, therefore, are not to be considered limiting in scope.

DETAILED DESCRIPTION

Embodiments of the present disclosure provide a power distribution discovery system that discovers which equipment modules are wired to receive electrical power from each of one or more power distribution units configured in a computing rack. Modern computing rack designs often utilize multiple power distribution units in each computing rack for various reasons that may include, for example, power redundancy, power sharing, and/or for efficient organization of the electrical power cabling in the computing rack. Nevertheless, when these computing racks are implemented with multiple power distribution units, diagnosing power problems often becomes difficult due mainly to the difficulty in identifying which power distribution unit each equipment module is coupled to and receiving power from. Embodiments of the present disclosure provide a solution to this problem by including a first communication circuit in each power distribution unit that communicates with complementary second communication circuits configured in each equipment module using the power cable coupled between each equipment module and the power distribution unit as a communication medium. Through the circuits, each power distribution unit may discover those equipment modules to which it is connected and report such findings so that users may readily ascertain which equipment modules may be receiving electrical power from each power distribution unit configured in the computing rack.

Figure 1A:
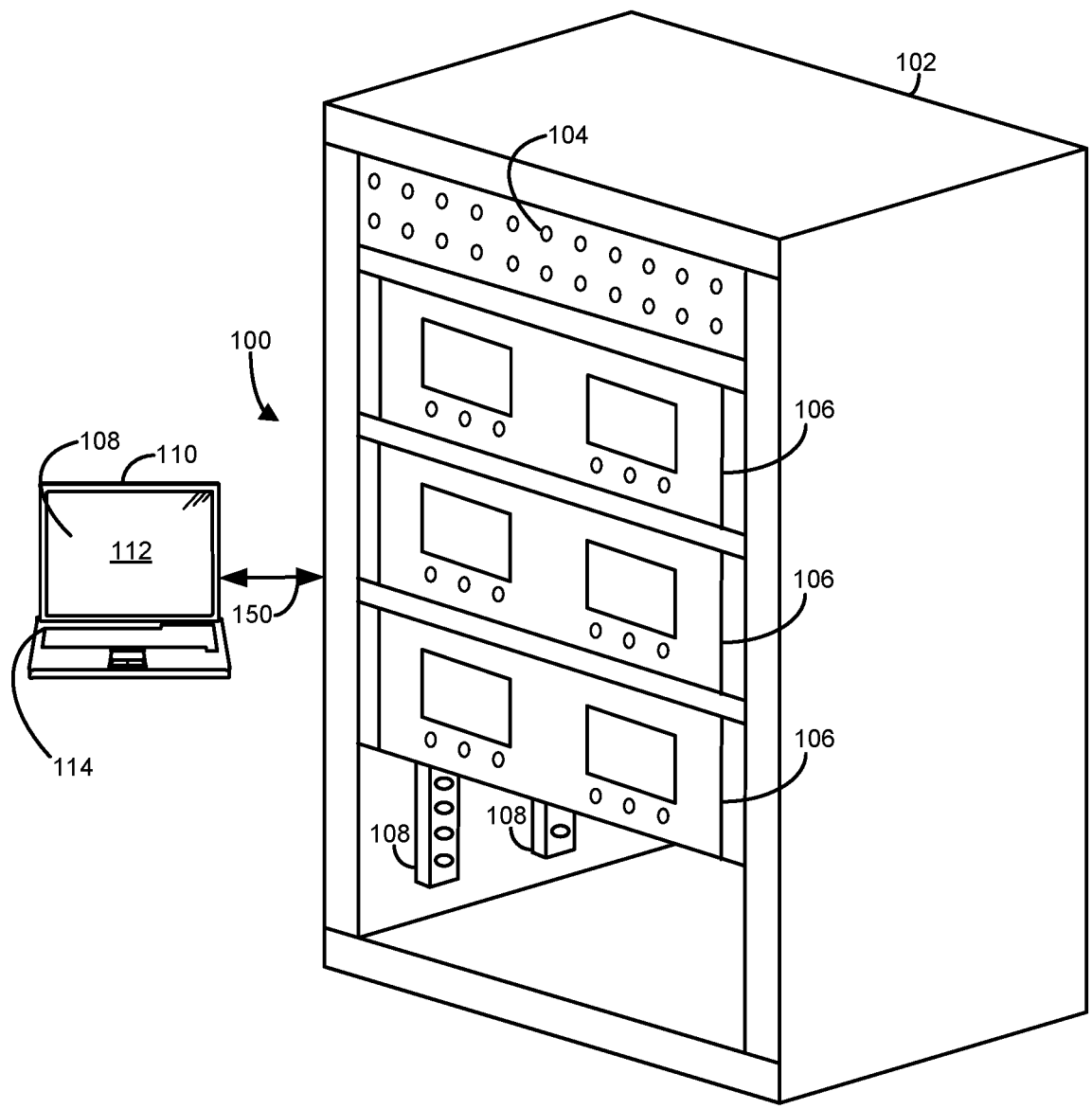
FIG. 1A illustrates an example power distribution discovery system that may be implemented in a computing rack according to one embodiment of the present disclosure.

FIG. 1A illustrates an example power distribution discovery system 100 that may be implemented in a computing rack 102 according to one embodiment of the present disclosure. The computing rack 102 generally includes a box-like structure that forms an enclosure 104 for the placement of one or more equipment modules 106. As will be described in detail herein below, the system 100 includes one or more power distribution units 108 that receives identifying signals from each equipment module 106 to which it is coupled and transmits information associated with the signals to a computing device 110, which in turn, displays the information on a user interface 112 for view by a user. Using this information, the user may ascertain which power distribution unit 108 from among multiple power distribution units 108 is powering which equipment modules 106.

The computing rack 102 may be any suitable type. Examples of such computing racks include those that are generally referred to as 19-inch racks or 23-inch racks. The 19-inch racks may be constructed according to various specifications, such as the Electronics Industries Alliance 310-D (EIA 310D) specification. Although 23-inch racks are often used by the telecommunication industry, 19-inch racks may be relatively more common with other computing system implementations. In general, these computing racks typically comprise a structure in which one or more equipment modules 106 may be mounted.

The computing rack 102 can have any shape or size. The computing rack provides for the configuration of a relatively large number of equipment modules in a small volume. To supply electrical power to these equipment modules, one or more power distribution units may be provided. Problems arise, however, in that when multiple power distribution units 108 are used, the relatively large quantity of modules results in cluttered wiring within the computing rack such that isolating each equipment module according to the power distribution unit that it is powered by often becomes difficult. Many time equipment modules 106 have power uncoupled during the isolation process when it is undesirable to do so. Such undesirable interruption can cause critical processing interruptions of critical tasks—often with dire consequences. Embodiments of the present disclosure provide a solution to this problem by identifying those equipment modules 106 that are coupled to, and receive electrical power, from which power distribution unit 108 and display the information for view by a user.

The computing device 110 is coupled to each power distribution unit 108 by one or means of communication 150 including direct wired by Ethernet, USB, or other wired connection or by a wireless connection including a network. Wireless connections can include Bluetooth and IR, but are not so limited. The wireless network can include, for example, the Internet, an intranet, a secure network, a virtual private network, a local area network, a wide area network, or a cellular network, but is not so limited. The computing device 110 has a display 108 and an input device 114. The computing device is described in more detail in FIG. 4 below.

Figure 1B:
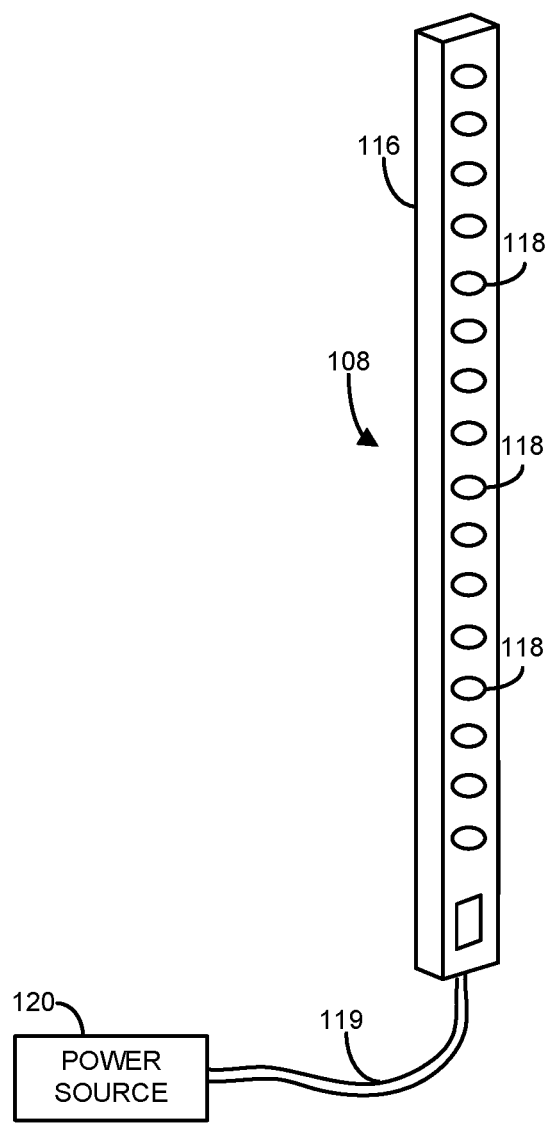
FIG. 1B illustrates an example power distribution unit (power distribution unit) that has been removed from the computing rack to reveal several of its features according to one embodiment of the present disclosure.

FIG. 1B illustrates an example power distribution unit 108 that has been removed from the computing rack 102 to reveal several of its features according to one embodiment of the present disclosure. In general, the power distribution unit 108 comprises an elongated channel 116, or other similar structure, on which multiple outlets 118 may be configured. Additionally, the elongated channel 116 may be used to house electrical cables that electrically couple the outlets 118 thorough external cable 119 to a suitable power source 120. For example, the outlets 118 may include a National Electrical Manufacturers Association (NEMA) 5-15 grounded (Type B) connector as specified by the IEC although any type may be used. Although the power distribution unit 108 is described herein as including an elongated channel 116, it should be understood that the power distribution unit 108 may have any shape and/or size without deviating from the spirit and scope of the present disclosure.

Figure 2A:
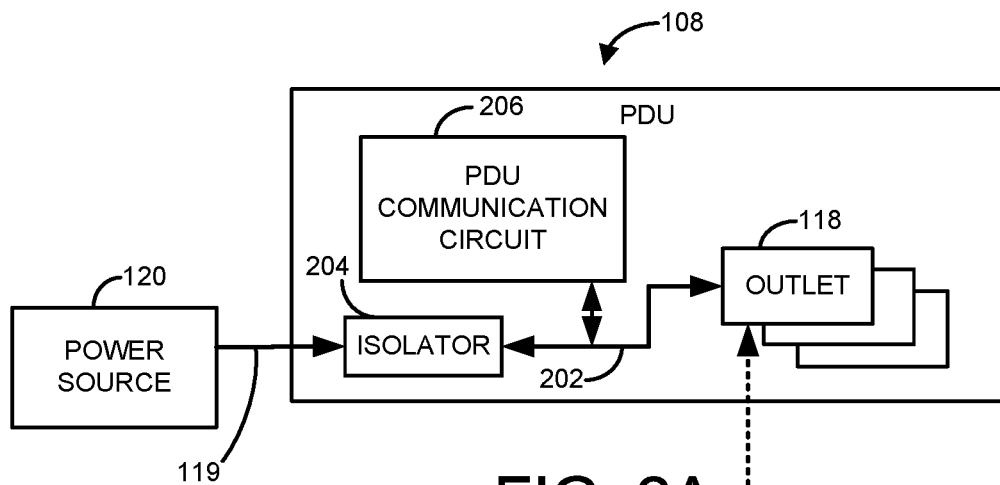
FIG. 2A illustrates an example wiring diagram of the power distribution unit of FIG. 1B according to one embodiment of the present disclosure.

FIG. 2A illustrates an example wiring diagram of the power distribution unit 108 of FIG. 1B according to one embodiment of the present disclosure. The power distribution unit 108 generally includes an electrical cable 202 that electrically couples the outlets 118 to an isolator 204 and then, indirectly, to a power source 120 using external cable 119. According to the teachings of the present disclosure, the power distribution unit 108 also includes a power distribution unit communication circuit 206 that can be coupled to the electrical cable 202, and is configured to receive identifying signals from each equipment module 106 to which it is connected. The power distribution unit communication circuit 206 may be coupled to the electrical cable 202 in any suitable manner. In one embodiment, the power distribution unit communication circuit 206 may be electrically coupled to the electrical cable 202, such as connected by a first signal wire to a 'neutral' wire of the electrical cable 202, and connecting a second signal wire to a 'hot' wire of the electrical cable 202. In another embodiment, the power distribution unit communication circuit 206 may be magnetically coupled to the electrical cable such that the power distribution unit communication circuit 206 may detect the identifying signal via magnetic flux variations generated by the electrical cable 202. Isolator 204 is an isolation circuit that prevents communications over the electrical cable 202 from leaving the power distribution unit 108 via the external cable 119. Without Isolator 204, the identifying signals would continue to be propagated on cable 119. The power distribution unit communication circuit 206 also facilitates coupling to a computing device 110 via connection 150 by wired or wireless communications mechanisms.

Figure 2B:
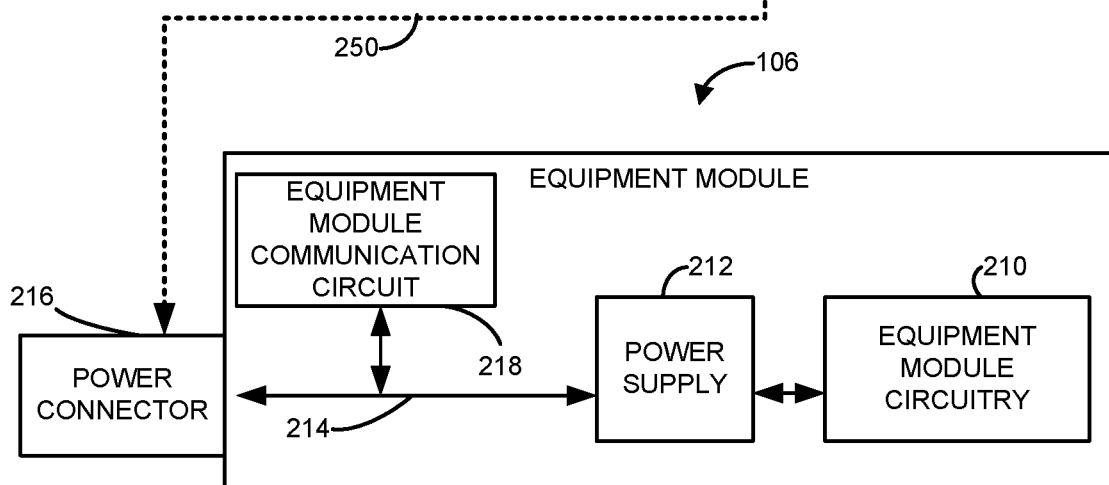
FIG. 2B illustrates an example equipment module that may be used with the power distribution discovery system according to one embodiment of the present disclosure.

FIG. 2B illustrates an example equipment module 106 that may be used with the system 100 according to one embodiment of the present disclosure. The equipment module 106 may be configured for placement in the computing rack 102 and may be referred to as a rack-mount module, rack mountable equipment, a rack-mount instrument, and the like. The equipment module 106 may be any type that is mountable and/or supported in the computing rack 102. Examples of such equipment modules include computing devices, blade servers, routers, switches, storage units (e.g., memory, hard disk drives, flash storage, etc.), power supply units, and the like.

In general, the equipment module 106 includes equipment module circuitry 210 to provide one or more functions such as described above. The equipment module 106 may also include a power supply 212 or other suitable power conversion system, for converting line power provided from the power distribution unit 108 to which it is connected to a form suitable for use by the equipment module circuitry 210. The power supply 212 may be electrically coupled to the power distribution unit 108 through the electrical cable 214 using a power connector 216, which has contacts that are configured to be electrically coupled to complementary contacts configured on an outlet 118 on the power distribution unit 108, and is shown by the connection cable 250 shown as a dotted line between outlet 118 and power connector 216. According to the teachings of the present disclosure, the equipment module 106 also includes an equipment module communication circuit 218 that is coupled to the electrical cable 214, and configured to generate the identifying signal that is to be received by the power distribution unit communication circuit 206 configured in the power distribution unit 108. The equipment module communication circuit 218 may be coupled to the electrical cable 214 in any suitable manner. In one embodiment, the equipment module communication circuit 218 may be electrically coupled to the electrical cable, such as by connecting a first signal wire to a 'neutral' wire of the electrical cable 214, and connecting a second signal wire to a 'hot' wire of the electrical cable 214. In another embodiment, the equipment module communication circuit 218 may be magnetically coupled to the electrical cable such that the power distribution unit communication circuit 206 may detect the identifying signal via magnetic flux variations generated by the electrical cable 214. Equipment module communication circuit 218 may also include any other type of communication mechanism to facilitate any type of wired or wireless communication.

In general, the equipment module communication circuit 218 and power distribution unit communication circuit 206 communicate with one another using the electrical cable 214 of the equipment module 106, connection cable 250, and the electrical cable 202 of the power distribution unit 108 as a transmission medium. Thus, the equipment module communication circuit 218 will only receive identifying signals from equipment modules 106 to which it's connected and receiving electrical power from. The equipment module communication circuit 218 and power distribution unit communication circuit 206 may communicate with one another using any suitable protocol. In one embodiment, the equipment module communication circuit 218 and power distribution unit communication circuit 206 may communicate using an X10 power line communication protocol. In another embodiment, the equipment module communication circuit 218 and power distribution unit communication circuit 206 may communicate using a PLC-BUS communication protocol. Any communication mechanism between the equipment module 106 and the power distribution module 108 is contemplated by the present disclosure.

Using such an arrangement of an equipment module communication circuit 218 configured in each equipment module 106 and a power distribution unit communication circuit 206 configured in the power distribution unit 108, the system 100 may identify which equipment module 106 is powered by each power distribution unit 108 in the computing rack 102. For example, each equipment module communication circuit 218 may generate a serial number of the associated equipment module 106 at ongoing intervals (e.g., periodic intervals) that may be received and processed by the power distribution unit communication circuit 206. As another example, each equipment module communication circuit 218 may be responsive to a query signal transmitted by the power distribution unit communication circuit 206 to transmit the serial number of its associated equipment module 106 to the power distribution unit communication circuit 206.

Although the power distribution unit 108 of FIG. 2A and the equipment module 106 of FIG. 2B illustrate an example power distribution unit 108 and equipment module 106 that may be used with the system 100, it should be understood that other power distribution units or equipment modules may have additional, fewer, or different components than what is shown herein without deviating from the spirit and scope of the present disclosure. For example, the power distribution unit 108 may include other components such as one or more switches for selectively applying electrical power to certain ones of the outlets 118 configured on the power distribution unit 108. As another example, the equipment module 106 may include other components other than circuitry, such as one or more lamps, or other light generating devices, for illuminating certain portions of the computing rack or for generating a signal to be received by the user. Such an equipment module 106 may, or may not have, any circuitry 210 such as is described above with respect to FIG. 2B.

Figure 3:
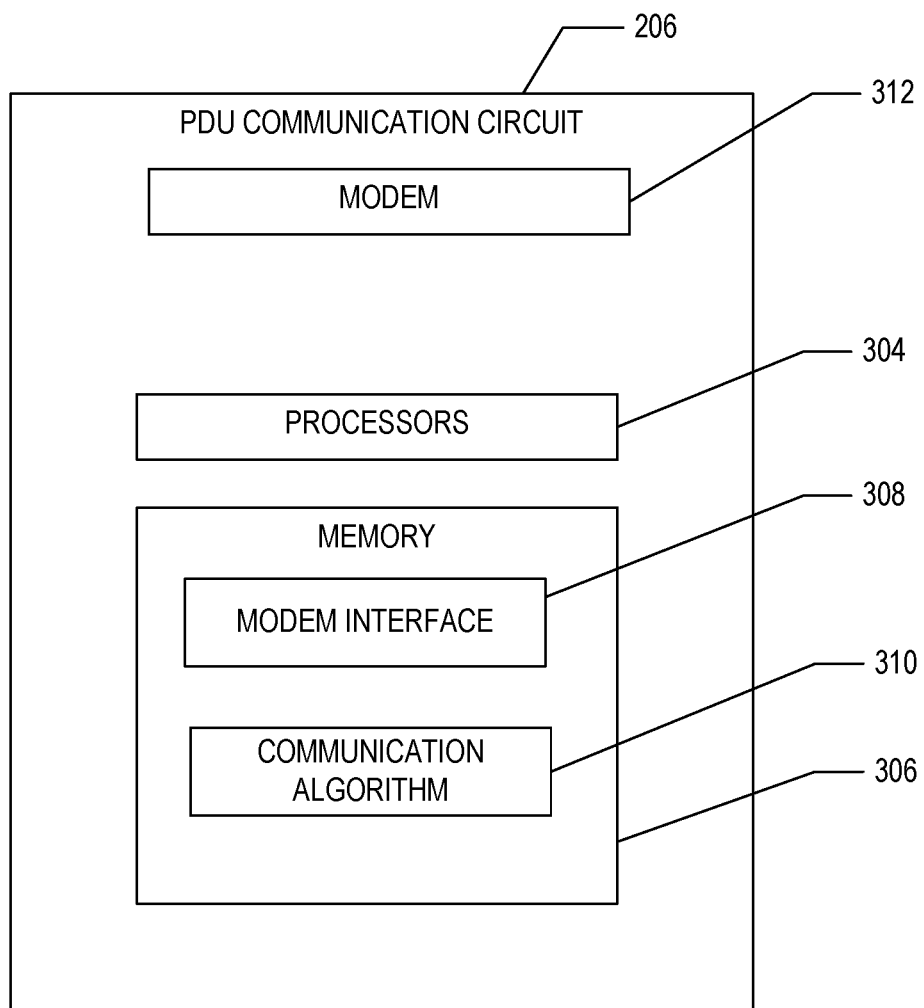
FIG. 3 illustrates an example power distribution unit communication circuit according to one embodiment of the present disclosure.

FIG. 3 illustrates an example power distribution unit communication circuit 206 according to one aspect of the present disclosure. The power distribution unit communication circuit 206 includes one or more processors 304 and memory 306 that stores a modem interface 308 and a communication algorithm 310 that are executed by the processors 304. The modem interface 308 receives identifying information from a modem 312 that is in communication with the electrical cable 202 of its respective power distribution unit 108, processes the information, and then transfers the processed information to the communication algorithm 310 that transmits the information, through the modem interface 308 to the modem 312 to the computing device 110 using means of communication 150.

Although the power distribution unit communication circuit 206 is shown and described as a computer-based design incorporating instructions stored in a memory 306 and executed by a processor 304, it should be understood that the power distribution unit communication circuit 206 may be embodied in other specific forms, such as using discrete and/or integrated analog circuitry, field programmable gate arrays (FPGAs), application specific integrated circuitry (ASICs), or any combination thereof. Communication circuit 206 also comprises the necessary circuitry to communicate with the computing device 110 using means of communication 150.

Figure 4:
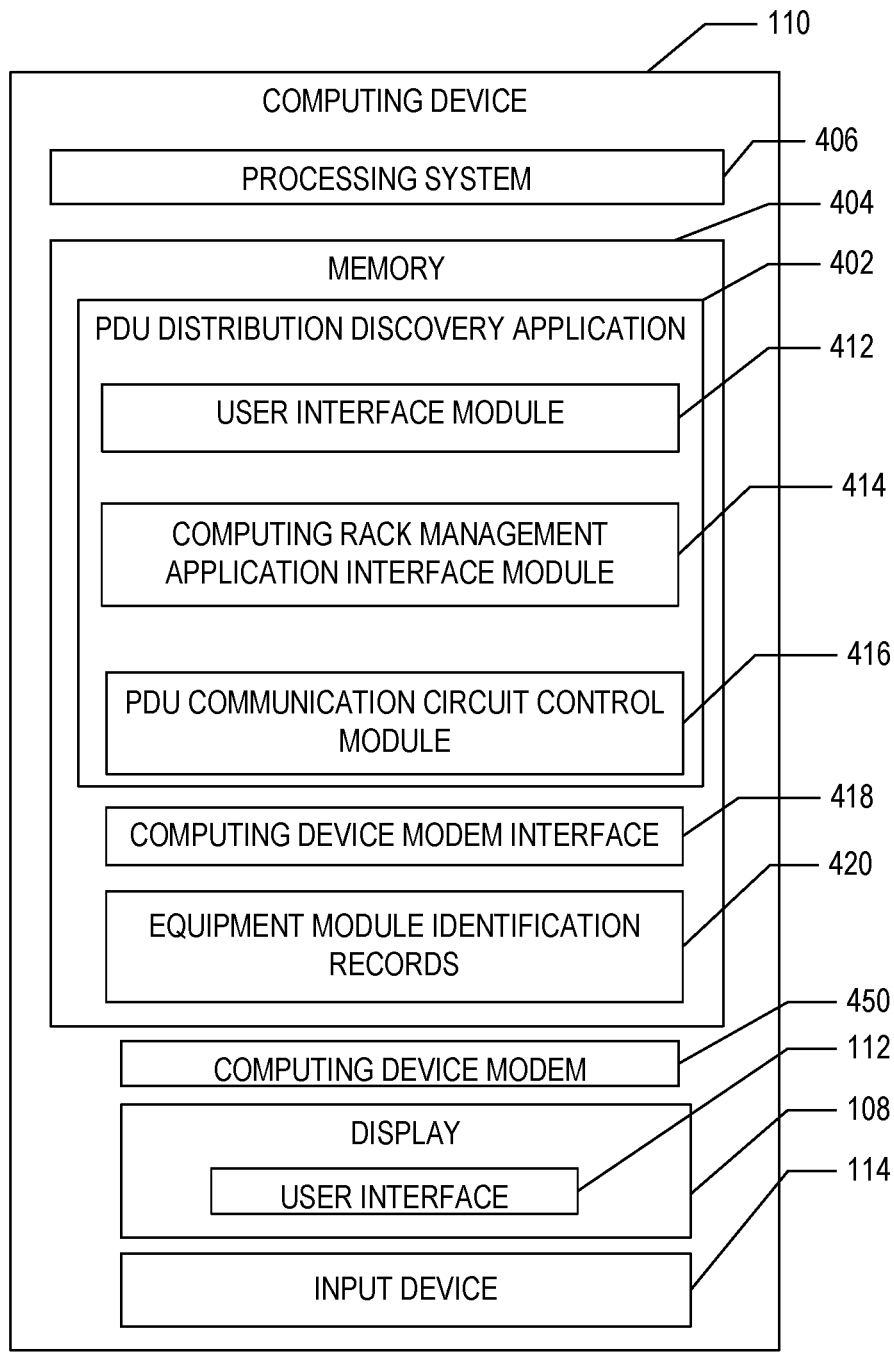
FIG. 4 illustrates a block diagram of an example computing device that may be used to execute a power distribution discovery application according to one embodiment of the present disclosure.

Referring now to FIG. 4, a block diagram of an example power distribution unit distribution discovery application 402 executed on the computing device 110 is depicted according to one aspect of the present disclosure. The power distribution unit distribution discovery application 402 is stored in a memory (e.g., computer readable media) 404 and executed on a processing system 406 of the computing device 110. The computing device 110 may include any type of computing system, such as one or more computing systems in communication with one another, one or more personal computers, one or more mobile computers and/or other mobile devices.

The computing device 110 also includes a user interface 112 (e.g., a graphical user interface (GUI)) displayed on a display 108, such as a computer monitor, for displaying data. The computing device 110 may also include an input device 114, such as a keyboard or a pointing device (e.g., a mouse, trackball, pen, or touch screen) to enter data into or interact with the user interface 112. According to one aspect, the power distribution unit distribution discovery application 402 includes instructions or modules that are executable by the processing system 406 as will be described in detail herein below.

The memory 404 includes volatile media, nonvolatile media, removable media, non-removable media, and/or another available medium. By way of example and not limitation, non-transitory computer readable medium comprises computer storage media, such as non-transient storage memory, volatile media, nonvolatile media, removable media, and/or non-removable media implemented in a method or technology for storage of information, such as computer readable instructions, data structures, program modules, or other data.

A user interface module 412 communicates with the user interface 112, or other remotely configured computing device to facilitate receipt of input data and/or output data from or to a user (e.g., an administrator of the computing rack 102), respectively. The user interface module 412 may display information to, and receive user information from the user in any suitable form, such as via a graphical user interface (GUI) or a command line interface (CLI). For example, the user interface module 412 may display a list of the equipment modules 106 that are powered by one or more power distribution units 108 on a display of the computing device 110. As another example, the user interface module 412 may receive user input for initiating a discovery process, or for receiving user input for manipulating one or more settings of how the system 100 operates, such as whether the equipment module communication circuit 218 transmit the identifying information periodically, or whether the equipment modules 106 transmit the identifying information in response to a request from the power distribution unit communication circuit 206.

A computing rack management application interface module 414 provides an interface to a computing rack management application that manages the operation of the computing rack 102. For example, the computing rack management application interface module 414 may communicate with the computing rack management application to receive a request for associating those equipment modules 106 that receive electrical power from a particular power distribution unit 108 and in response, generate a request to be transmitted to the power distribution unit communication circuit 206 of that power distribution unit 108 for obtaining the requested information. The computing rack management application may be any suitable type that manages the operation of the computing rack 102, which may also include other computing racks, such as a data center that often employs the use of equipment modules 106 that may be distributed over multiple computing racks. In this manner, the system 100 may be used to provide equipment module/power distribution unit association information that may be useful for management operations of the computing rack management application.

A power distribution unit communication circuit control module 416 manages the operation of the power distribution unit communication circuit 206 configured in each power distribution unit 108 in the computing rack 102. Additionally, the power distribution unit communication circuit control module 416 may also manage the operation of each or certain power distribution unit communication circuits 206 configured in each equipment module 106 in the computing rack 102. For example, the power distribution unit communication circuit control module 416 may communicate with the power distribution unit communication circuit 206 to issue an instruction to the equipment module communication circuits 218 to which it is connected, to adjust its operation (e.g., change from transmitting its identifying information upon request to periodically transmitting its identifying information, change an elapsed period of time between each transmission, etc.). In one embodiment, the operation of certain ones of the equipment module communication circuits 218 may be adjusted. In other embodiments, the operation of certain ones of the equipment module communication circuits 218 may be set during manufacture such that they are not adjustable by the power distribution unit communication circuit control module 416. In yet another embodiment, certain ones of the equipment module communication circuits 218 may be adjusted manually by the user. For example, certain equipment module communication circuits 218 may include one or more switches that may be switched on or off for setting how they operated in the system 100.

It should be appreciated that the modules described herein are provided only as examples and that the power distribution unit distribution discovery application 402 may have different modules, additional modules, or fewer modules than those described herein. For example, one or more modules as described in FIG. 4 may be combined into a single module. As another example, certain modules described herein may be encoded on, and executed on other computing systems, such as on one that is used to execute the computing rack management application.

Figure 5:
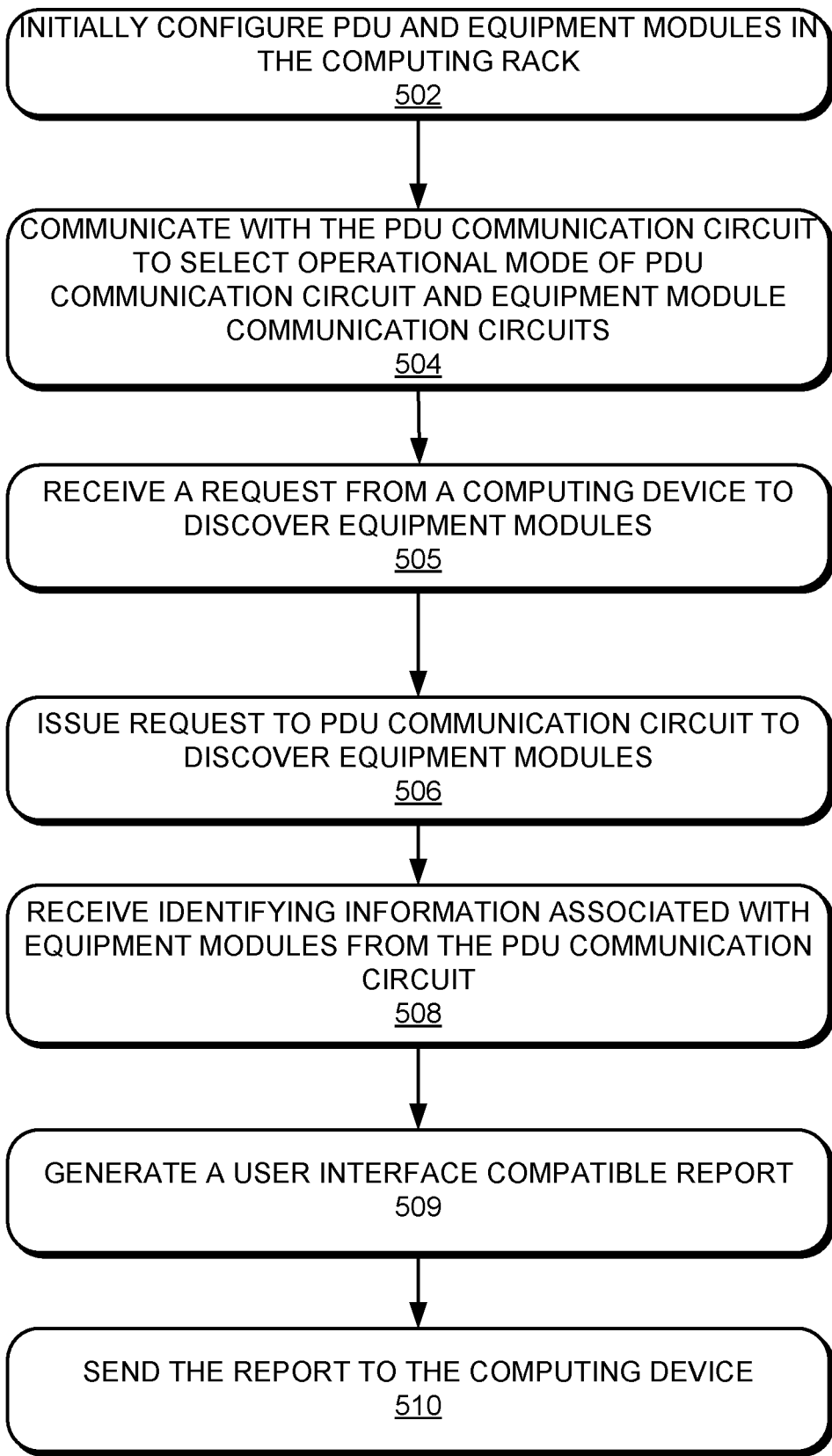
FIG. 5 illustrates an example process that may be performed by the application according to one embodiment of the present disclosure.

FIG. 5 illustrates an example process that may be performed by the application 402 according to one embodiment of the present disclosure. Initially, one or more of the power distribution units 108 along with multiple equipment modules 106 are configured in the computing rack 102. In some cases, in which the operation of the equipment module communication circuit 218 in certain equipment modules 106 are set manually (e.g., using one or more control switches on the equipment module communication circuit), the operation of the equipment module communication circuit 218 in those equipment modules 106 may be set when configured in the computing rack 102.

At block 502, the application 402 communicates with the power distribution unit communication circuit 206 in each power distribution unit 108 to select the operational mode of the system 100. For example, the application 402 may issue an instruction to the equipment module communication circuit 218 to periodically receive identifying information from the equipment module communication circuit 218 of each equipment module 106 to which it is connected. Upon receipt of this instruction, the equipment module communication circuit 218 may then issue a request to the equipment module communication circuit 218 of each equipment module 106 to which it is connected to periodically transmit its identifying information. The request may also include other operational instructions, such as an elapsed period of time between each transmission. In yet another embodiment, the each equipment module 106 can be configured to transmit identifying information at pre-determined intervals in the absence of a request from the power distribution unit 108.

At block 504, the application 402 issues a request to discover those equipment modules 106 that are coupled to (e.g., powered by) the power distribution unit 108. In one embodiment, if the system 100 has been configured so that the equipment module communication circuits 218 periodically transmit their identifying information, then the power distribution unit communication circuit 206 may return the equipment module identification records 420 stored in its memory. However in another embodiment, if the system 100 has been configured so that the equipment module communication circuits 218 transmit their identifying information upon request, then the power distribution unit communication circuit 206 may issue a request to all equipment module communication circuits 218 to transmit their identifying information. Upon receipt of the identifying information, the identifying information may be forwarded to the application 402.

At block 505, the power distribution unit 108 receives a request from the computing device 110 to discover the equipment modules 106 connected to outlets 118. This request could be received via a wired or wireless connection using any one of a variety of communication protocols. In another embodiment the power distribution unit 108 could receive a request from computing device 110 to determine if an equipment module 106 associated with a particular identification is using on outlet 118 on the power distribution unit 108.

At block 506, the application 402 issues a request to the power distribution unit communication circuit 206 to discover the equipment modules that it is coupled to. Thereafter at block 508, the application 402 receives the identifying information from the power distribution unit communication circuit 206. At block 509, the power distribution unit 108 generates a report for the received identifying information for the plurality of equipment modules 106 connected to the plurality of outlets 118 that is compatible with user interface 112 for view by a user of computing device 110. At block 510 the power distribution unit 108 sends the report to the computing device 110.

In one embodiment, the blocks described above may be initiated by a computing rack management application that controls the operation of the equipment modules 106 in the computing rack. For example, if a power outage occurs to certain equipment modules 106 in the computing rack 102, a user of the computing rack management application may enter user input for instructing the application 402 to perform a discovery process to determine whether those equipment modules 106 that have experienced the power outage are powered by the subject power distribution unit 108. As another example, the user of the computing rack management application may instruct the application to perform a discovery process to identify those equipment modules 106 that receive electrical power from the power distribution unit 108 to ensure that the power distribution unit 108 is not being overloaded with too many devices. As yet another example, the user of the computing rack management application may, using user input, instruct the application to perform a discovery process for identifying the equipment modules 106 that receive electrical power from the power distribution unit 108 for performing one or more diagnostics processes on the equipment modules 106 of the computing rack 102 (e.g., fault isolation, mis-wiring of certain equipment modules, etc.).

The process described above may be repeated to identify those equipment modules 106 that received electrical power from the power distribution unit 108, or to identify those equipment modules 106 that receive electrical power from other power distribution units 108. Nevertheless, when use of the application 402 is no longer needed or desired, the process ends.

Although FIG. 5 describes one example of a process that may be performed by the application 402, it should be understood that other processes may be performed without departing from the spirit or scope of the present disclosure. For example, the process described above may include additional, fewer, or different actions than what is described herein. As another example, the communication device 206 in the power distribution unit 108 may be configured to transmit its identifying information, while the communication device 218 in the equipment modules 106 may be configured to receive the identifying information. Therefore, in such a case, the application 402 may communicate with the communication devices 218 in each equipment modules 106 to determine which power distribution unit 108 that is receiving electrical power from.

Figure 6:
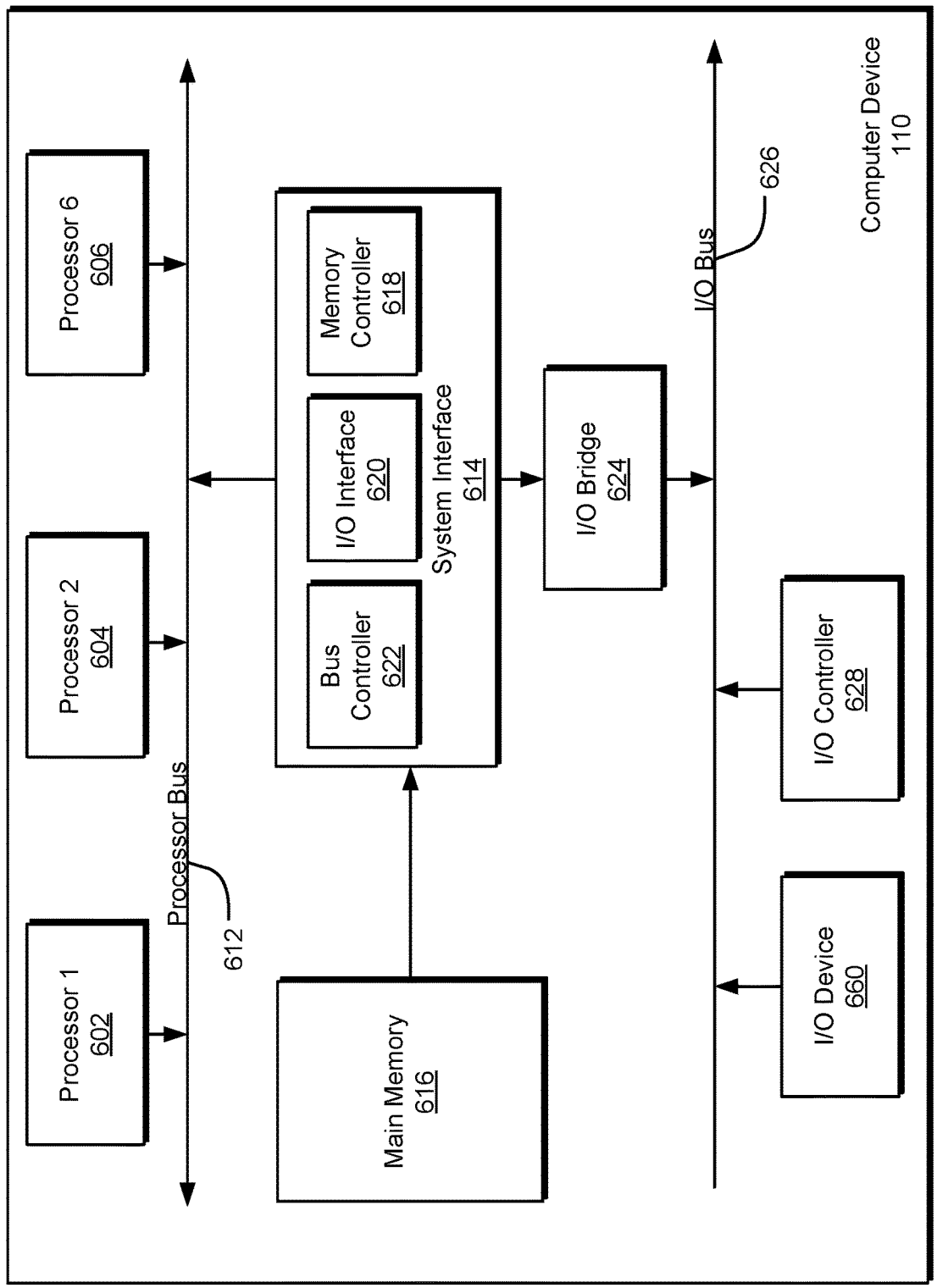
FIG. 6 illustrates an example computer device according to one embodiment of the present disclosure.

For example, FIG. 6 is a block diagram illustrating an example of computing device 110 which may be used in implementing the embodiments of the present disclosure. The computer device 110 includes one or more processors 602-606. Processors 602-606 may include one or more internal levels of cache (not shown) and a bus controller or bus interface unit to direct interaction with the processor bus 612. Processor bus 612, also known as the host bus or the front side bus, may be used to couple the processors 602-606 with the system interface 614. System interface 614 may be connected to the processor bus 612 to interface other components of the computing device 110 with the processor bus 612. For example, system interface 614 may include a memory controller 618 for interfacing a main memory 616 with the processor bus 612. The main memory 616 typically includes one or more memory cards and a control circuit (not shown). System interface 614 may also include an input/output (I/O) interface 620 to interface one or more I/O bridges or I/O devices with the processor bus 612. One or more I/O controllers and/or I/O devices may be connected with the I/O bus 626, such as I/O controller 628 and I/O device 660, as illustrated.

I/O device 660 may also include an input device (not shown), such as an alphanumeric input device, including alphanumeric and other keys for communicating information and/or command selections to the processors 602-606. Another type of user input device includes cursor control, such as a mouse, a trackball, or cursor direction keys for communicating direction information and command selections to the processors 602-606 and for controlling cursor movement on the display device.

Computing device 110 may include a dynamic storage device, referred to as main memory 616, or a random access memory (RAM) or other computer-readable devices coupled to the processor bus 612 for storing information and instructions to be executed by the processors 602-606. Main memory 616 also may be used for storing temporary variables or other intermediate information during execution of instructions by the processors 602-606. Computing device 110 may include a read only memory (ROM) and/or other static storage device coupled to the processor bus 612 for storing static information and instructions for the processors 602-606. The system set forth in FIG. 6 is but one possible example of a computer system that may employ or be configured in accordance with aspects of the present disclosure.

According to one embodiment, the above techniques may be performed by computer computing device 110 in response to processor 602-606 executing one or more sequences of one or more instructions contained in main memory 616. These instructions may be read into main memory 616 from another machine-readable medium, such as a storage device. Execution of the sequences of instructions contained in main memory 616 may cause processors 602-606 to perform the process blocks described herein. In alternative embodiments, circuitry may be used in place of or in combination with the software instructions. Thus, embodiments of the present disclosure may include both hardware and software components.

A computer readable medium includes any mechanism for storing or transmitting information in a form (e.g., software, processing application) readable by a machine (e.g., a computer). Such media may take the form of, but is not limited to, non-volatile media and volatile media. Non-volatile media includes optical or magnetic disks. Volatile media includes dynamic memory, such as main memory 616. Common forms of machine-readable medium may include, but is not limited to, magnetic storage medium (e.g., hard disk drive); optical storage medium (e.g., CD-ROM); magneto-optical storage medium; read only memory (ROM); random access memory (RAM); erasable programmable memory (e.g., EPROM and EEPROM); flash memory; or other types of medium suitable for storing electronic instructions.

Embodiments of the present disclosure include various operations or blocks, which are described in this specification. The blocks may be performed by hardware components or may be embodied in machine-executable instructions, which may be used to cause a general-purpose or special-purpose processor programmed with the instructions to perform the blocks. Alternatively, the blocks may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

The description above includes example systems, methods, techniques, instruction sequences, and/or computer program products that embody techniques of the present disclosure. However, it is understood that the described disclosure may be practiced without these specific details.

In the present disclosure, the methods disclosed may be implemented as sets of instructions or software readable by a device. Further, it is understood that the specific order or hierarchy of blocks in the methods disclosed are instances of example approaches. Based upon design preferences, it is understood that the specific order or hierarchy of blocks in the method can be rearranged while remaining within the disclosed subject matter. The accompanying method claims present elements of the various blocks in a sample order, and are not necessarily meant to be limited to the specific order or hierarchy presented.

The described disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form (e.g., software, processing application) readable by a machine (e.g., a computer). The machine-readable medium may include, but is not limited to, magnetic storage medium (e.g., hard disk drive), optical storage medium (e.g., CD-ROM); magneto-optical storage medium, read only memory (ROM); random access memory (RAM); erasable programmable memory (e.g., EPROM and EEPROM); flash memory; or other types of medium suitable for storing electronic instructions.

For example, FIG. 6 is a block diagram illustrating an example of a host or computer computing device 110 which may be used in implementing the embodiments of the present disclosure. The computer system (system) includes one or more processors 602-606. Processors 602-606 may include one or more internal levels of cache (not shown) and a bus controller or bus interface unit to direct interaction with the processor bus 612. Processor bus 612, also known as the host bus or the front side bus, may be used to couple the processors 602-606 with the system interface 614. System interface 614 may be connected to the processor bus 612 to interface other components of the computing device 110 with the processor bus 612. For example, system interface 614 may include a memory controller 618 for interfacing a main memory 616 with the processor bus 612. The main memory 616 typically includes one or more memory cards and a control circuit (not shown). System interface 614 may also include an input/output (I/O) interface 620 to interface one or more I/O bridges or I/O devices with the processor bus 612. One or more I/O controllers and/or I/O devices may be connected with the I/O bus 626, such as I/O controller 628 and I/O device 660, as illustrated.

I/O device 660 may also include an input device (not shown), such as an alphanumeric input device, including alphanumeric and other keys for communicating information and/or command selections to the processors 602-606. Another type of user input device includes cursor control, such as a mouse, a trackball, or cursor direction keys for communicating direction information and command selections to the processors 602-606 and for controlling cursor movement on the display device.

Computing device 110 may include a dynamic storage device, referred to as main memory 616, or a random access memory (RAM) or other computer-readable devices coupled to the processor bus 612 for storing information and instructions to be executed by the processors 602-606. Main memory 616 also may be used for storing temporary variables or other intermediate information during execution of instructions by the processors 602-606. Computing device 110 may include a read only memory (ROM) and/or other static storage device coupled to the processor bus 612 for storing static information and instructions for the processors 602-606. The system set forth in FIG. 6 is but one possible example of a computer system that may employ or be configured in accordance with aspects of the present disclosure.

According to one embodiment, the above techniques may be performed by computer computing device 110 in response to processor 602-606 executing one or more sequences of one or more instructions contained in main memory 616. These instructions may be read into main memory 616 from another machine-readable medium, such as a storage device. Execution of the sequences of instructions contained in main memory 616 may cause processors 602-606 to perform the process blocks described herein. In alternative embodiments, circuitry may be used in place of or in combination with the software instructions. Thus, embodiments of the present disclosure may include both hardware and software components.

Embodiments of the present disclosure include various operations or blocks, which are described in this specification. The blocks may be performed by hardware components or may be embodied in machine-executable instructions, which may be used to cause a general-purpose or special-purpose processor programmed with the instructions to perform the blocks. Alternatively, the blocks may be performed by a combination of hardware, software and/or firmware.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

A number of variations and modifications of the disclosed embodiments can also be used. Specific details are given in the above description to provide a thorough understanding of the embodiments. However, it is understood that the embodiments may be practiced without these specific details. For example, well-known circuits, processes, algorithms, structures, and techniques may be shown without unnecessary detail in order to avoid obscuring the embodiments. It is also the case that modules, software, or algorithms can be performed on one server, multiple servers or share the same server. A platform is a major piece of software, such as an operating system, an operating environment, or a relational database or data store, under with various smaller application programs can be designed to run. An operating system is the most important software program running on most computer systems. It manages a processors memory, processes, all of the software and programs loaded onto it, and all of the connected hardware. The operating system's job is to manage all of the software and hardware on the computer. Most of the time, there are many different software programs operating at once as well as multiple connected hardware devices. There are many operating systems—the most basic is the disk operating system or "DOS." Each type of computer or device typically has its own different operating systems. Some typical operating systems are iOS, Windows, Android, and Linux.

The networks disclosed may be implemented in any number of topologies. A network is made of many computing devices that can include computers, servers, mainframe computers, network devices, peripherals, or other device connected together. A network allows these devices to share data and communicate with each other. The most prominent network is the Internet—that connects billions of devices all over the world. There are many types of network devices including: computers, consoles, firewalls, hubs, routers, smartphones, switches, wearables, watches, and cameras. Networks are set up in many different ways referred to as network topologies. Some of the most common topologies include tree, hybrid, ring, mesh star, and bus. The tree topology is the generally used topology. A computer is typically an electronic device for storing and processing data according to instruction it reads. A console is a text entry and display device. A firewall is network security system, either hardware- or software-based, that controls incoming and outgoing network traffic based on a set of rules, and acts as a barrier between a trusted network and other untrusted networks—such as the Internet—or less-trusted networks—a firewall controls access to the resources of a network through a positive control model. This means that the only traffic allowed onto the network defined in the firewall policy is allowed; all other traffic is denied. A hub is a connection point for multiple devices in a network. A hub typically has multiple ports such that if packets of data arrive at one port they are copied to the other ports. A router is a device that forwards data packets along the network. A router connects two or more networks such as an intranet to the internet. Routers use headers and forwarding tables to determine how data packets should be sent using certain paths in the network. The typical router protocol using ICMP to communicate and configure the best path. A network switch is different from a router. Switches serve as controllers that enable networked devices to communicate with each other. Switches create networks while routers connect networks together.

Networks operate on the seven layer Open System Interconnection (OSI) model. The OSI model defines a conceptual networking framework to implement protocols and divides the task of networking into a vertical stack of the seven layers. In the OSI model, communication control is passed through the layers from the first to the seventh layer. The first or "top" layer is the "physical" layer. Layer 1 transmits the bit stream of ones and zeros indicated by electrical impulse, light, or radio frequency signals—thus providing a method of interacting with actual hardware in a meaningful way. Examples of the physical layer include Ethernet, FDDI, B8ZS, V.35, V.24, and RJ45. The second layer is called the Data Link layer. At layer 2 data packets are encoded and decoded into a bit stream in compliance with transmission protocols that control flow control and frame synchronization. The Data Link layer 2 is actually a combination of two different layers: the Media Access Control (MAC) layer and the Logical Link Control (LLC) layer. The MAC layer controls a computer's access to the network. The LLC basically controls frame synchronization, flow control, and various types of error correction. Examples of the Data Link layer include PPP, FDDI, ATM, IEEE 802.5/802.2, IEEE 802.3/802.2, HDLC, and Frame Relay. The third OSI layer, called the "Network" layer, provides the switching and routing technology to create logical paths to transmit data from one node to another in the network. The Network layer also performs the function of routing, forwarding, addressing, internetworking, error handling, congestion control, and packet sequencing. Layer 3 examples include AppleTalk, DDP, IP, and IPX. The fourth OSI layer is the Transport layer. Layer 4 provides transparent transfer of data between devices. Layer 4 also performs error recovery and provides flow control for complete data transfer. Examples of layer 4 include SPX, TCP, and UDP. OSI layer 5 called the Session layer because it manages and terminates the connections between different applications. The Session layer coordinates communication between applications. It sets up communications and terminates the communications between applications at each end—establishing and ending a "session." Examples include NFS, NetBios, names, RPC, and SQL. Layer 6 is called the Presentation Layer. Layer 6 is really the "transformation" layer—transforming data from the final layer to a format the network understands and vice versa. Layer 6 formats and encrypts data sent on the network and decrypts the data from the network. Examples include ASCII, EBCDIC, TIFF, GIF, PICT, JPEG, MPEG, and MIDI. Finally, the last layer 7, is called the Application Layer. Everything at this layer is specific to applications, and this layer provides the services for email, file transfers, and other network applications. Examples include WWW browsers, NFS, SNMP, FTP, Telnet, and HTTP.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), complex instruction set computers (CISCs), reduced instruction set computers (RISCs), advanced RISC machines (ARMs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof. A processor is implemented in logic circuitry that includes the basic functions of AND, NAND, OR, and NOR functions Functionally, processors are typically composed of RAM as well as address and data buses, the processing circuitry and accumulators. The busses supply the data and programming instructions from RAM, ROM, CACHE, or other memory to the processing circuitry. The speed of a processor depends both on the speed of the processing circuitry as well as the speed of the data and address busses that supply the circuitry. And the speed of the data and address buses are also gated by the speed of the RAM. It is critical that all of these components have speeds that are matched to one another to maximize processor performance. Processors use machine level instruction codes to manipulate data. Other instructions must be compiled to machine level instructions to for the processor to perform the operations. Dual core processors have dual processing circuitry and multiple address and data buses.

Also, it is noted that the embodiments may be described as a process which is depicted as a flowchart, a flow diagram, a swim diagram, a data flow diagram, a structure diagram, or a block diagram. Although a depiction may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, and/or various other storage mediums capable of storing that contain or carry instruction (s) and/or data. Cache memory, also called the central processing unit (CPU) memory, is random access memory that the processor can access more quickly than standard RAM. Cache memory is typically integrated into the circuitry with the processing unit, but sometimes can be placed on a separate chip. The principle purpose of cache memory is to store the program instruction for the operational software such as an operating systems. Most long running software instructions reside in cache memory if they are accessed often.

While the principles of the disclosure have been described above in connection with specific apparatuses and methods, it is to be clearly understood that this description is made only by way of example and not as limitation on the scope of the disclosure.

What is claimed is:

1. A method comprising:
   receiving, at a power distribution unit, a request to identify an equipment module powered by the power distribution unit, wherein the request includes a schedule that indicates when the power distribution unit is to identify the equipment module;
   transmitting, via a first communication circuit of the power distribution unit and to a second communication circuit of the equipment module, a first request for identifying information at a first time, the first request including an indication that the identifying information is to be transmitted repeatedly, wherein the first request includes the schedule, and wherein the first request for identifying information is transmitted over an electrical cable that transmits electrical power to the equipment module from a power source;
   receiving, via the first communication circuit of the power distribution unit, and from the second communication circuit of the equipment module, the identifying information, wherein the identifying information is received over the electrical cable, and wherein the identifying information is received according to the schedule; and
   generating a report that includes the identifying information.

2. The method of claim 1, further comprising:
   transmitting the first request at one or more other times based on the schedule, wherein the first time and the one or more other times are separated by predefined time interval.

3. The method of claim 1, wherein the identifying information includes a serial number of the equipment module.

4. The method of claim 1, further comprising:
   receiving, at the power distribution unit, a modified schedule that indicates a new time interval that is to elapse between each transmission;
   transmitting, via the first communication circuit of the power distribution unit and to the second communication circuit of the equipment module, a second request for identifying information, the second request including the modified schedule; and receiving, via the first communication circuit of the power distribution unit, and from the second communication circuit of the equipment module, the identifying information, wherein the identifying information is received according to the modified schedule.

5. The method of claim 1, further comprising:
receiving, at the power distribution unit, a modified schedule that indicates that the identifying information is no longer to be transmitted repeatedly; and
transmitting, via the first communication circuit of the power distribution unit and to the second communication circuit of the equipment module, a communication indicating that the identifying information is no longer to be transmitted repeatedly.

6. The method of claim 1, further comprising:
receiving, via the first communication circuit and from a computing device, a request for identifying information from each equipment module of a plurality of equipment modules connected to the power distribution unit;
generating a report that includes identifying information of each equipment module of a plurality of equipment modules, the report including an indication that the plurality of equipment modules receive power from the power distribution unit; and
transmitting the report to the computing device.

7. The method of claim 1, wherein the power distribution unit includes an isolator that prevent communications to the first communication circuit from being propagated to the power source.

8. A system comprising:
a power distribution unit comprising:
one or more processors;
a first communication circuit; and
a non-transitory computer-readable medium storing instructions, which when executed by the one or more processors, cause the one or more processors to perform operations including:
receiving, at the power distribution unit, a request to identify an equipment module powered by the power distribution unit, wherein the request includes a schedule that indicates when the power distribution unit is to identify the equipment module;
transmitting, via the first communication circuit of the power distribution unit and to a second communication circuit of the equipment module, a first request for identifying information at a first time, the first request including an indication that the identifying information is to be transmitted repeatedly, wherein the first request includes the schedule, and wherein the first request for identifying information is transmitted over an electrical cable that transmits electrical power to the equipment module from a power source;
receiving, via the first communication circuit of the power distribution unit, and from the second communication circuit of the equipment module, the identifying information, wherein the identifying information is received over the electrical cable, and wherein the identifying information is received according to the schedule; and
generating a report that includes the identifying information.

9. The system of claim 8, wherein the operations further include:

transmitting the first request at one or more other times based on the schedule, wherein the first time and the one or more other times are separated by predefined time interval.

10. The system of claim 8, wherein the identifying information includes a serial number of the equipment module.

11. The system of claim 8, wherein the operations further include:
receiving, at the power distribution unit, a modified schedule that indicates a new time interval that is to elapse between each transmission;
transmitting, via the first communication circuit of the power distribution unit and to the second communication circuit of the equipment module, a second request for identifying information, the second request including the modified schedule; and
receiving, via the first communication circuit of the power distribution unit, and from the second communication circuit of the equipment module, the identifying information, wherein the identifying information is received according to the modified schedule.

12. The system of claim 8, wherein the operations further include:
receiving, at the power distribution unit, a modified schedule that indicates that the identifying information is no longer to be transmitted repeatedly; and
transmitting, via the first communication circuit of the power distribution unit and to the second communication circuit of the equipment module, a communication indicating that the identifying information is no longer to be transmitted repeatedly.

13. The system of claim 8, wherein the operations further include:
receiving, via the first communication circuit and from a computing device, a request for identifying information from each equipment module of a plurality of equipment modules connected to the power distribution unit;
generating a report that includes identifying information of each equipment module of a plurality of equipment modules, the report including an indication that the plurality of equipment modules receive power from the power distribution unit; and
transmitting the report to the computing device.

14. The system of claim 8, wherein the power distribution unit includes an isolator that prevent communications to the first communication circuit from being propagated to the power source.

15. A non-transitory computer-readable medium storing instructions, which when executed by one or more processors, cause the one or more processors to perform operations including:
receiving, at a power distribution unit, a request to identify an equipment module powered by the power distribution unit, wherein the request includes a schedule that indicates when the power distribution unit is to identify the equipment module;
transmitting, via a first communication circuit of the power distribution unit and to a second communication circuit of the equipment module, a first request for identifying information at a first time, the first request including an indication that the identifying information is to be transmitted repeatedly, wherein the first request includes the schedule, and wherein the first request for identifying information is transmitted over an electrical cable that transmits electrical power to the equipment module from a power source;

receiving, via the first communication circuit of the power distribution unit, and from the second communication circuit of the equipment module, the identifying information, wherein the identifying information is received over the electrical cable, and wherein the identifying information is received according to the schedule; and generating a report that includes the identifying information.

16. The non-transitory computer-readable medium of claim 15, wherein the operations further include:
    transmitting the first request at one or more other times based on the schedule, wherein the first time and the one or more other times are separated by predefined time interval.

17. The non-transitory computer-readable medium of claim 15, wherein the identifying information includes a serial number of the equipment module.

18. The non-transitory computer-readable medium of claim 15, wherein the operations further include:
    receiving, at the power distribution unit, a modified schedule that indicates a new time interval that is to elapse between each transmission;
    transmitting, via the first communication circuit of the power distribution unit and to the second communication circuit of the equipment module, a second request for identifying information, the second request including the modified schedule; and
    receiving, via the first communication circuit of the power distribution unit, and from the second communication circuit of the equipment module, the identifying information, wherein the identifying information is received according to the modified schedule.

19. The non-transitory computer-readable medium of claim 15, wherein the operations further include:
    receiving, at the power distribution unit, a modified schedule that indicates that the identifying information is no longer to be transmitted repeatedly; and
    transmitting, via the first communication circuit of the power distribution unit and to the second communication circuit of the equipment module, a communication indicating that the identifying information is no longer to be transmitted repeatedly.

20. The non-transitory computer-readable medium of claim 15, wherein the operations further include:
    receiving, via the first communication circuit and from a computing device, a request for identifying information from each equipment module of a plurality of equipment modules connected to the power distribution unit;
    generating a report that includes identifying information of each equipment module of a plurality of equipment modules, the report including an indication that the plurality of equipment modules receive power from the power distribution unit; and
    transmitting the report to the computing device.

* * * * *

UNITED STATES PATENT AND TRADEMARK OFFICE
CERTIFICATE OF CORRECTION

PATENT NO. : 10,901,470 B2
APPLICATION NO. : 16/831181
DATED : January 26, 2021
INVENTOR(S) : Aimone Page 1 of 1

It is certified that error appears in the above-identified patent and that said Letters Patent is hereby corrected as shown below:

On the Title Page

Column 1, under Assignee, Line 2, after "Shores" insert -- (US) --.

In the Specification

In Column 5, Line 4, delete "310D" and insert -- 310-D --, therefor.

In Column 17, Line 42, delete "machine readable" and insert -- machine-readable --, therefor.

In Column 18, Line 6, delete "machine readable" and insert -- machine-readable --, therefor.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*